(12) United States Patent
Kuo et al.

(10) Patent No.: US 10,326,491 B2
(45) Date of Patent: Jun. 18, 2019

(54) TRANSCEIVING DEVICE

(71) Applicant: TAIWAN SEMICONDUCTOR MANUFACTURING COMPANY LTD., Hsinchu (TW)

(72) Inventors: Feng Wei Kuo, Hsinchu County (TW); Huan-Neng Chen, Taichung (TW); Lan-Chou Cho, Hsinchu (TW); Chewn-Pu Jou, Hsinchu (TW); Robert Bogdan Staszewski, Dublin (IE); Masoud Babaie, Zuid Holland (NL)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 39 days.

(21) Appl. No.: 15/800,991

(22) Filed: Nov. 1, 2017

(65) Prior Publication Data

US 2018/0343027 A1 Nov. 29, 2018

Related U.S. Application Data

(60) Provisional application No. 62/509,979, filed on May 23, 2017.

(51) Int. Cl.
*H04B 1/44* (2006.01)
*H03F 3/193* (2006.01)
(Continued)

(52) U.S. Cl.
CPC ............ *H04B 1/44* (2013.01); *H03F 1/565* (2013.01); *H03F 3/193* (2013.01); *H03F 3/245* (2013.01);
(Continued)

(58) Field of Classification Search
CPC . H04B 1/44; H03F 1/565; H03F 3/193; H03F 3/245; H03F 3/72; H03F 2200/294;
(Continued)

(56) References Cited

U.S. PATENT DOCUMENTS

| | | | | |
|---|---|---|---|---|
| 7,468,638 | B1* | 12/2008 | Tsai | H04B 1/48 331/126 |
| 9,907,035 | B2* | 2/2018 | Wu | H04W 56/00 |
| 2005/0002343 | A1* | 1/2005 | Toncich | H04B 1/44 370/282 |
| 2011/0057654 | A1* | 3/2011 | Sun | G01R 33/3628 324/318 |

(Continued)

OTHER PUBLICATIONS

Jan Prummel, Michail Papamichail, John Willms, Rahul Todi, William Aartsen, Wim Kruiskamp, Johan Haanstra, Enno Opbroek, Søren Rievers, Peter Seesink, Jan van Gorsel, Harrie Woering, and Chris Smit., "A 10 mW Bluetooth Low-Energy Transceiver With On-Chip Matching", IEEE Journal of Solid-State Circuits, vol. 50, No. 12, pp. 3077-3088, Dec. 2015.

(Continued)

*Primary Examiner* — Edward F Urban
*Assistant Examiner* — Max Mathew
(74) *Attorney, Agent, or Firm* — Juan Carlos A. Marquez; Marquez IP Law Office PLLC

(57) ABSTRACT

A transceiving device includes: a signal port, arranged to relay an RF input signal during a first mode, and to relay an RF output signal during a second mode different from the first mode; a receiver, coupled to the signal port; a transmitter, coupled to the signal port; and a first adjustable capacitor, coupled to the signal port. The second adjustable capacitor is arranged to have a first capacitance during the first mode such that the RF input signal is received by the receiver, and the second adjustable capacitor is arranged to have a second capacitance during the second mode such that the RF output signal is transmitted to the signal port.

19 Claims, 7 Drawing Sheets

(51) Int. Cl.
*H03F 1/56* (2006.01)
*H03F 3/24* (2006.01)
*H03F 3/72* (2006.01)
*H04W 4/80* (2018.01)
*H03F 3/26* (2006.01)
*H03L 7/08* (2006.01)

(52) U.S. Cl.
CPC ............... *H03F 3/265* (2013.01); *H03F 3/72* (2013.01); *H04W 4/80* (2018.02); *H03F 2200/294* (2013.01); *H03F 2200/318* (2013.01); *H03F 2200/411* (2013.01); *H03F 2200/451* (2013.01); *H03F 2200/537* (2013.01); *H03F 2203/7215* (2013.01); *H03F 2203/7221* (2013.01); *H03J 2200/06* (2013.01); *H03J 2200/14* (2013.01); *H03L 7/08* (2013.01); *H03L 2207/50* (2013.01)

(58) Field of Classification Search
CPC ......... H03F 2200/318; H03F 2200/411; H03F 2200/451; H03F 2200/537; H03F 2203/7221; H04W 4/80; H03L 7/08; H03L 2207/50
USPC ........................................................... 455/78
See application file for complete search history.

(56) References Cited

U.S. PATENT DOCUMENTS

| | | | |
|---|---|---|---|
| 2013/0207741 A1* | 8/2013 | Presti | H03H 7/48 333/111 |
| 2014/0199951 A1* | 7/2014 | Yu | H04B 1/44 455/83 |
| 2014/0269217 A1* | 9/2014 | Jenwatanavet | G04R 60/10 368/10 |
| 2015/0180542 A1* | 6/2015 | Jang | G06Q 20/3278 455/41.1 |
| 2016/0254898 A1* | 9/2016 | Sjoland | H04B 1/0458 370/281 |
| 2017/0085097 A1* | 3/2017 | Xiao | H02J 5/005 |

OTHER PUBLICATIONS

Tomohiro Sano, Masakazu Mizokami, Hiroaki Matsui, Keisuke Ueda, Kenichi Shibata, Kenji Toyota, Tatsuhito Saitou, Hisayasu Sato, Koichi Yahagi, Yoshihiro Hayashi., "A 6.3mW BLE Transceiver Embedded RX Image-Rejection Filter and TX Harmonic-Suppression Filter Reusing On-Chip Matching Network", IEEE Int. Solid-State Circuits Conf.(ISSCC) Dig. Tech. Papers, Feb. 2015, pp. 240-241.

\* cited by examiner

TRANSCEIVING DEVICE

CROSS-REFERENCE TO RELATED APPLICATION

This application claims the benefit of U.S. Provisional Application No. 62/509,979, filed May 23, 2017.

BACKGROUND

Bluetooth low energy (BLE) is currently the most popular radio standard for Internet-of-Things (IoT) applications. IoT nodes are mainly battery operated but increasingly use energy harvesting to sustain their long-term operation. This places heavy emphasis on ultra-low-power (ULP) aspects of IoT Rx, which is considered the most energy-hungry subsystem. Unfortunately, those versatile high-performance RXs developed for the cellular market suffer from relatively high power dissipation, which naturally prevents their use in the emerging IoT applications that take the ULP dissipation and relatively low performance as their starting point.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
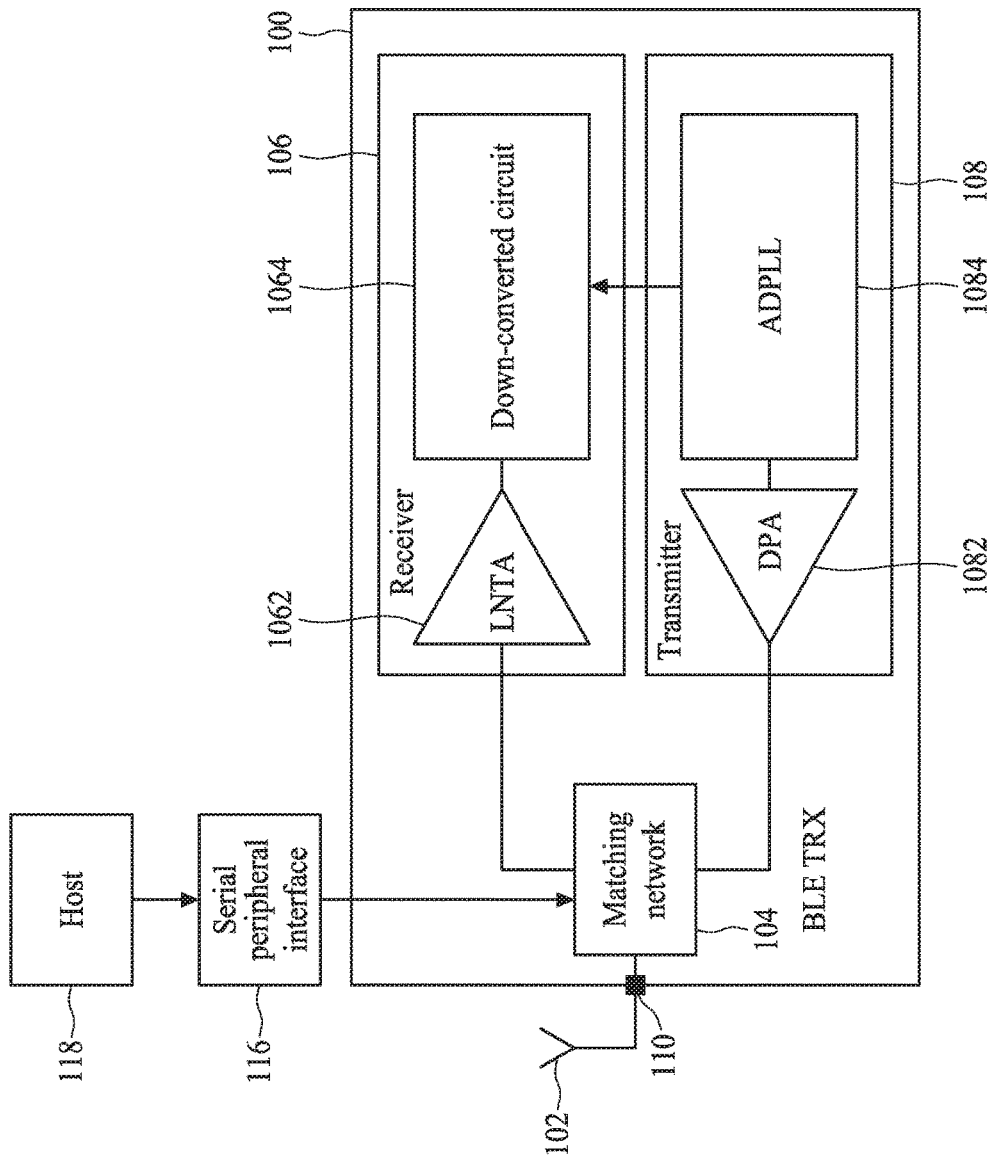
FIG. 1 is a block diagram illustrating a Bluetooth low energy transceiver in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In the field of ultra-low-power (ULP) wireless transceivers (TRXs) for the Internet of Things (IoT), Bluetooth low energy (BLE) may be used for short-range IoT communications. BLE is an extension of the Bluetooth (BT) that specifies an increased channel spacing of 2 MHz and a relaxed interference tolerance to allow for low-power (LP) implementations. The present embodiments focus on implementing such a TRX in low-cost bulk CMOS technology node. The objective is to maximally reduce the system cost by fully integrating all the RF TRX building blocks, including the antenna-interfacing circuitry, such as the power amplifier (PA) matching network and transmit/receive (T/R) switch, while maximally reducing the power consumption.

To address the above objectives of full system integration at ULP consumption, including amenability with digital processors in face of strong push toward a sub-threshold operation, the proposed TRX may exploit all-digital and digitally intensive architectures for the frequency synthesizer, transmitter (TX), and receiver (RX). A time-to-digital converter (TDC) in an all-digital PLL (ADPLL) employs a string of inverters to convert a time difference between reference and variable (RF) clocks into a digital phase error. Power consumption and resolution of the TDC improve with technology scaling. Furthermore, at the same area, device matching improves thus reducing TDC nonlinearity and the level of fractional spurs. On the RX side, most of signal processing and filtering is done using discrete-time (DT) passive switched capacitor circuits. Waveforms required for driving the switches are also generated using digital logic. To provide signal gain, DT techniques use inverter-based gm cells that are always compatible with digital technology.

As the technology scales, MOS switches become faster with lower parasitic capacitance. Consequently, digital waveform generators also become faster and more power efficient. On the other hand, metal capacitor density improves by migrating to more advanced technology, resulting in a reduced area.

FIG. 1 is a block diagram illustrating a Bluetooth low energy transceiver (BLE TRX) 100 in accordance with some embodiments. The BLE TRX 100 comprises an antenna 102, a matching network 104, a receiver 106, and a transmitter 108. The receiver 106 comprises a low-noise transconductance amplifier (LNTA) 1062 and a down-converted circuit 1064. The transmitter 108 comprises a digital PA (DPA) 1082 and an all-digital phase-lock loop (ADPLL) 1084. The BLE TRX 100 integrates all the required RF (e.g. the ADPLL 1084) and IF (e.g. the down-converted circuit 1064) building blocks and further includes a T/R antenna switch having an adjustable digital PA (e.g. the digital PA 1082) and a low-noise transconductance amplifier (e.g. the LNTA 1062) matching networks such that the signal port (or RF input/output (RFIO) pin) 110 may be directly connected to the antenna 102. In other words, the combination of the matching network 104, the LNTA 1062, and the digital PA 1082 is capable of switching the LNTA 1062 to the antenna 102 during a first mode, e.g. the receiving mode, and switching the digital PA 1082 to the antenna 102 during a second mode, e.g. the transmitting mode. The matching network 104 may be treated as a "soft" T/R switch. The matching network 104 may provide good impedance matching between the transmitting mode and the receiving mode of the BLE TRX 100. The BLE TRX 100 may operate in low supply voltage and may overcome process variation easily. In addition, an external/discrete T/R antenna switch may be omitted in the present embodiment. An external/discrete antenna filter may also be omitted in the present embodiment. A serial peripheral interface (SPI) facilitates the switching between the receiving mode and the transmitting mode.

The DPA 1082 may be implemented by a switched-mode class-E/F2 topology with a transformer-based matching network, which may enhance its efficiency at low supply voltage. According to the present embodiments, the BLE TRX 100 has relatively low power and cost because the BLE TRX 100 is highly integrated and has small die area. The transformers of the matching network 104 is arranged to incorporate the associated active devices underneath them with no significant loss of performance or power efficiency.

In the receiver 106, the intermediate frequency (IF) is increased to just beyond the flicker corner frequency and filter the IF signal using complex-domain cascaded bandpass filters (BPFs). The first of filters is clocked at multiples of the LO frequency performing sufficient filtering and harmonic rejection.

Figure 2:
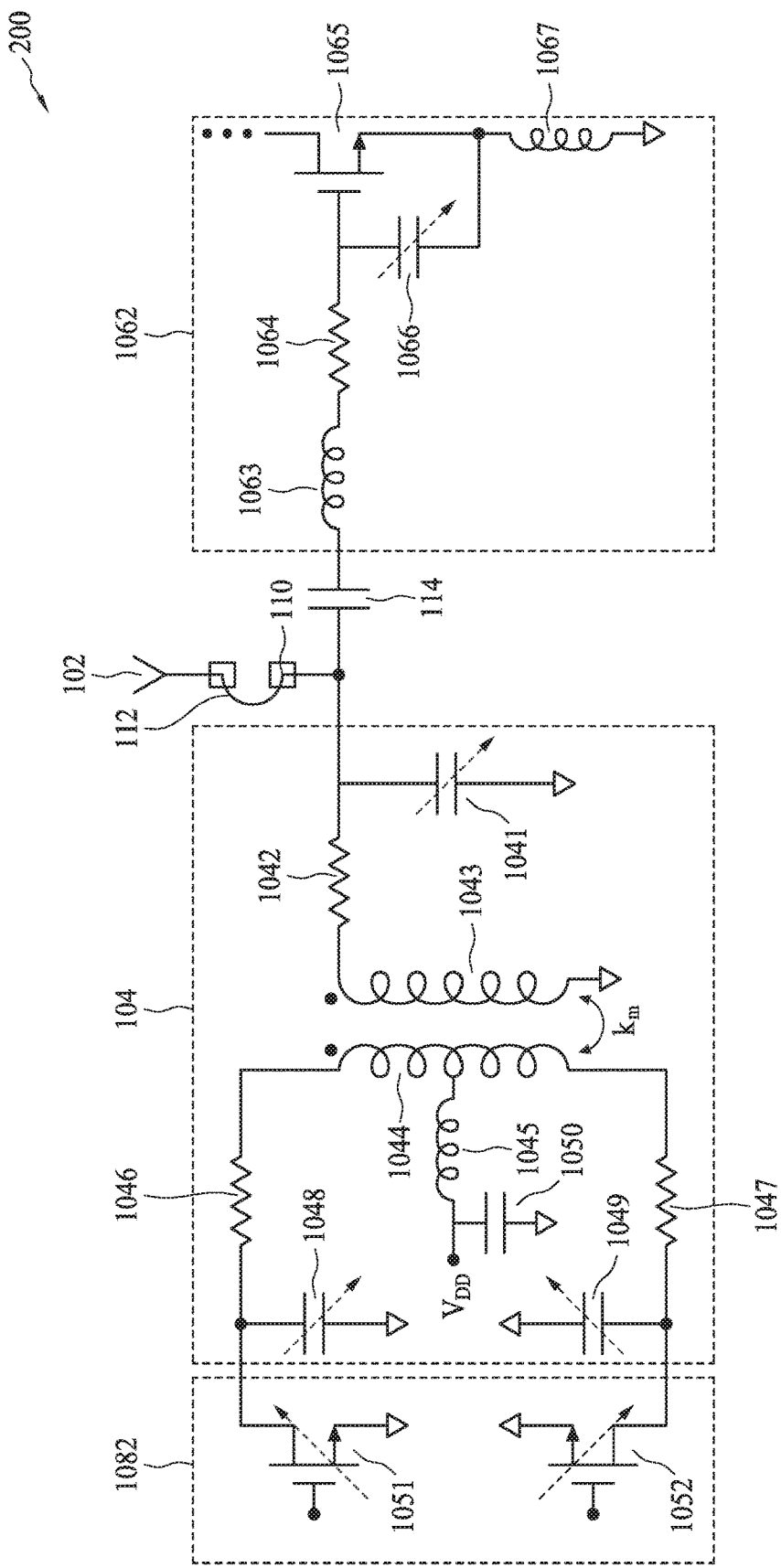
FIG. 2 is a circuit diagram illustrating a front end of a transceiving device in accordance with some embodiments.

FIG. 2 is a circuit diagram illustrating a front end 200 of a transceiving device (e.g. the BLE TRX 100) in accordance with some embodiments. For brevity, the front end 200 comprises the antenna 102, the LNTA 1062, the matching network 104, and the DPA 1082. According to some embodiments, a bonding wire 112 is bonded between the signal port 110 and the antenna 102. A capacitor 114 having a first terminal directly connected to the signal port 110 and a second terminal coupled to the LNTA 1062. The signal port 110 is arranged to relay or transfer a radio frequency (RF) input signal during the receiving mode, and to relay or transfer an RF output signal during the transmitting mode. The capacitor 114 has a large capacitance in order to block the direct current (DC) signal from the signal port 110. According to some embodiments, the LNTA 1062 is composed of two stages: a single-input/single-output common-source cascode low-noise amplifier (LNA) and a common-source transconductance (gm) amplifier. However, for brevity, FIG. 2 merely shows the input stage of the LNTA 1062. The input stage of the LNTA 1062 comprises an inductor 1063, a resistor 1064, a N-channel field-effect transistor 1065, an adjustable capacitor 1066, and an inductor 1067. The inductor 1063 has a first terminal coupled to the second terminal of the capacitor 114. The inductor 1063 is arranged to have an inductance $L_G$. The resistor 1064 has a first terminal coupled to a second terminal of the inductor 1063. The resistor 1064 may be a parasitic series resistor of the inductor 1063, and the resistance of the resistor is $r_{loss}$. The field-effect transistor 1065 has a gate terminal coupled to a second terminal of the resistor 1064. The adjustable capacitor 1066 has a first terminal and a second terminal coupled to the gate terminal and a source terminal of the field-effect transistor 1065 respectively. The capacitance of the adjustable capacitor 1066 is $C_{gs}$. The inductor 1067 has a first terminal coupled to the source terminal and a reference voltage level (e.g. a ground voltage) respectively. The inductance of the inductor 1067 is $L_1$. A drain terminal of the field-effect transistor 1065 is arranged to output a receiving signal during the receiving mode, which may be a current signal. According to some embodiments, the inductor 1063, the resistor 1064, the adjustable capacitor 1066, the inductor 1067, and the field-effect transistor 1065 may form an amplifier.

The matching network 104 comprises a first adjustable capacitor 1041, a first resistor 1042, a first winding 1043, a second winding 1044, a third winding 1045, a second resistor 1046, a third resistor 1047, a second adjustable capacitor 1048, a third adjustable capacitor 1049, and a capacitor 1050. The adjustable capacitor 1041 has a first terminal directly connected to the signal port 110, and a second terminal coupled to the ground voltage. The capacitance of the adjustable capacitor 1041 is $C_2$. The resistor 1042 has a first terminal coupled to the signal port 110. The first winding 1043 has a first terminal coupled to a second terminal of the resistor 1042, and a second terminal coupled to the ground voltage. The resistor 1042 may be a parasitic series resistor of the first winding 1043, and the resistance of the resistor 1042 is $r_s$. The first winding 1043 is electromagnetically coupled to the second winding 1044 to form a transformer, in which the second winding 1044 may be the primary winding and the first winding 1043 may be the secondary winding. Moreover, the inductance of the first winding 1043 is $L_s$, and the inductance of the second winding 1044 is $L_p$.

The resistor 1046 has a first terminal coupled to a first terminal of the second winding 1044. The resistor 1047 has a first terminal coupled to a second terminal of the second winding 1044. The resistor 1046 and the resistor 1047 may be the parasitic series resistors of the second winding 1044. For brevity, the resistances of the resistor 1046 and the resistor 1047 are $0.5 r_p$. The third winding 1045 has a first terminal coupled to a middle of the second winding 1044, and a second terminal coupled to a second reference voltage (e.g. a supply voltage VDD). The capacitor 1050 has a first terminal coupled to the second terminal of the third winding 1045, and a second terminal coupled to the ground voltage. The adjustable capacitor 1048 has a first terminal coupled to a second terminal of the resistor 1046. The adjustable capacitor 1049 has a first terminal coupled to a second terminal of the resistor 1047. For brevity, the capacitances of the adjustable capacitor 1048 and the adjustable capacitor 1049 are $0.5 C_1$.

According to some embodiments, the DPA 1082 may be a class $E/F_2$ power amplifier. However, for brevity, FIG. 2 merely shows a last stage of the DPA 1082. The last stage of the DPA 1082 comprises a first N-channel field-effect transistor 1051 and a second N-channel field-effect transistor 1052. The field-effect transistor 1051 has a gate terminal for receiving a first pre-transmit signal during the transmitting mode, a drain terminal coupled to the second terminal of the resistor 1046, and a source terminal coupled to the ground voltage. The field-effect transistor 1052 has a gate terminal for receiving a second pre-transmit signal during the transmitting mode, a drain terminal coupled to the second terminal of the resistor 1047, and a source terminal coupled to the ground voltage. According to some embodiments, the aspect ratios (W/L) of the field-effect transistors 1051 and 1052 are adjustable.

Figure 3:
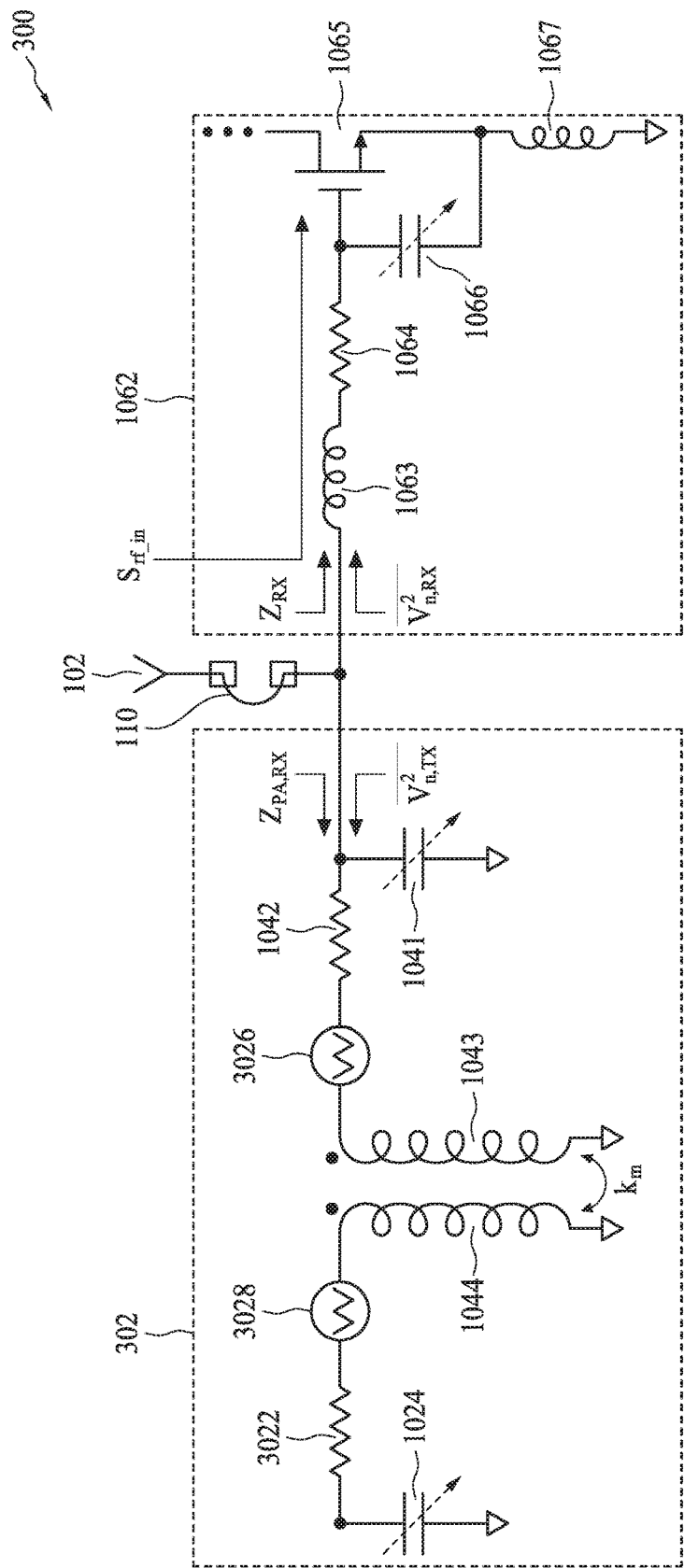
FIG. 3 is a diagram illustrating an equivalent circuit of the front end in FIG. 2 during the receiving mode in accordance with some embodiments.

During the receiving mode, the gate terminals of the field-effect transistors 1051 and 1052 are connected to the ground voltage to turn off the field-effect transistors 1051 and 1052. FIG. 3 is a diagram illustrating an equivalent circuit 300 of the front end 200 during the receiving mode in accordance with some embodiments. During the receiving mode, an RF input signal $S_{rf\_in}$ is transmitted from the antenna 102 to the LNTA 1062 via the signal port 110. In the receiving mode, the field-effect transistors 1051 and 1052 are OFF and, consequently, the transmitter (i.e. the matching network 104 and the DPA 1082) is simplified to be a PA transformer-based TX matching network (TXMN) 302 acting as a second-order resonator. According to some embodiments, the main resonant frequency of the second-order resonator is arranged to be substantially equal to the operating frequency of the RF input signal $S_{rf\_in}$. In the TXMN 302, the resistor 1046 and the resistor 1047 are simplified to be a resistor 3022 with a resistance $r_p$. The adjustable capacitor 1048 and the adjustable capacitor 1049 are simplified to be an adjustable capacitor 3024 with a capacitance $C_1$. A first equivalent input noise 3026 and a second equivalent input noise 3028 are also shown on the first winding 1043 and the second winding 1044 respectively. The value of the first equivalent input noise 3026 is $4KTr_s$. The value of the second equivalent input noise 3028 is $4KTr_p$.

Figure 4:
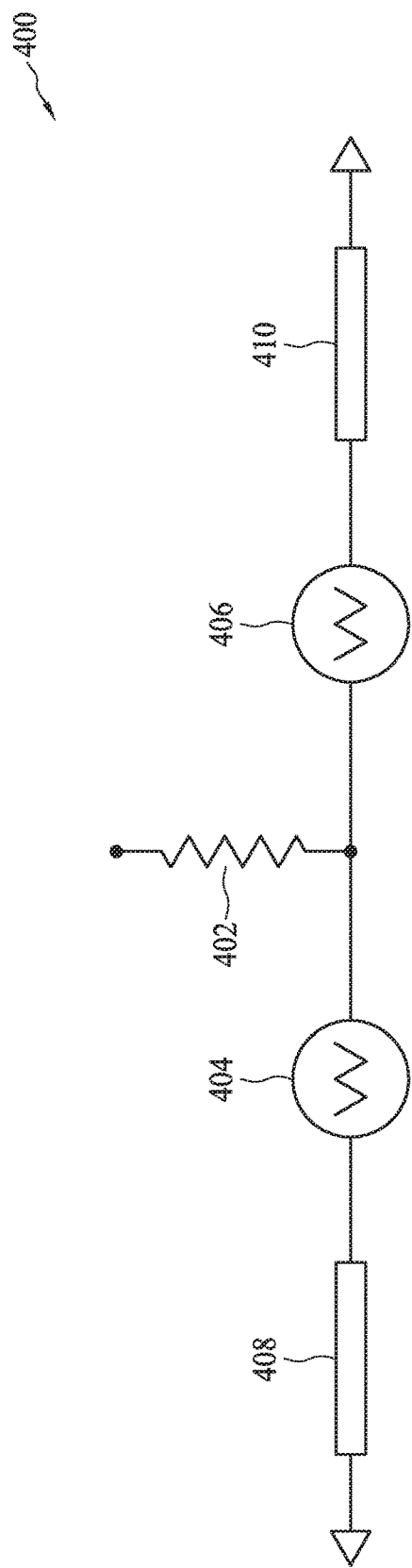
FIG. 4 is a diagram illustrating a Thevenin equivalent circuit of a transmitter matching network and a low-noise transconductance amplifier during the receiving mode in accordance with some embodiments.

During the receiving mode, the arrangement of the transmitter is to alleviate the side effects of TXMN 302 on the receiver's noise factor and input return loss. To analyze the system during the receiving mode, the Thevenin equivalent circuit of the TXMN 302 and LNTA 1062 are employed as shown in FIG. 4. FIG. 4 is a diagram illustrating the Thevenin equivalent circuit 400 of the TXMN 302 and LNTA 1062 during the receiving mode in accordance with some embodiments. The Thevenin equivalent circuit 400 comprises a resistor 402, a first equivalent input noise 404, a second equivalent input noise 406, a first transmission line 408, and a second transmission line 410. The resistor 402 has a resistance $R_s$ (e.g. 50 ohm) equivalent to the antenna 102. The equivalent input noise 404 represents an input noise of the TXMN 302. The equivalent input noise 406 represents an input noise of the LNTA 1062. The first transmission line 408 represents an input impedance of the TXMN 302 at an operating frequency. The second transmission line 410 represents an input impedance of the LNTA 1062 at the operating frequency.

The RX noise factor (F) can be calculated the following equation (1):

$$F = 1 + \frac{R_S}{4KT} + \frac{\overline{V_{n,RX}^2}}{|Z_{RX}|^2} + \frac{R_S}{4KT} \cdot \frac{\overline{V_{n,TX}^2}}{|Z_{PA,RX}|^2} \quad (1)$$

$\overline{V_{n,RX}^2}$ and $Z_{RX}$ are the equivalent input noise 406 and the input impedance of LNTA 1062 at the operating frequency $\omega_0$ respectively. $Z_{RX}$ and $\overline{V_{n,RX}^2}$ are estimated by the following equations (2) and (3) respectively:

$$Z_{RX} = r_{loss} + \frac{g_m L_1}{C_{gs}} + \left((L_G + L_1) \cdot s + \frac{1}{C_{gs} \cdot s}\right) \xrightarrow{\omega_0 = 1/\sqrt{C_{gs} \cdot (L_G + L_1)}} Z_{RX} = \quad (2)$$

$$r_{loss} + \frac{g_m L_1}{C_{gs}}$$

$$\overline{V_{n,RX}^2} = 4KT[r_{loss} + \gamma g_m \cdot (L_1 \omega_0)^2] \quad (3)$$

Furthermore, $Z_{PA,RX}$ and $\overline{V_{n,TX}^2}$ are the output impedance of TXMN 302 and the equivalent output noise 404 at the operating frequency $\omega_0$ respectively. $Z_{PA,RX}$ and $\overline{V_{n,TX}^2}$ are estimated by the following equations (4) and (5) respectively:

$$Z_{PA,RX} = \frac{s^3(L_p L_s C_1(1-k_m^2)) + s^2(C_1(L_s r_p + L_p r_s)) + s(L_s + r_s r_p C_1) + r_s}{s^4(L_p L_s C_1 C_2(1-k_m^2)) + s^3(C_1 C_2(L_s r_p + L_p r_s)) + s^2(L_p C_1 + L_s C_2 + r_p r_s C_1 C_2) + s(r_p C_1 + r_s C_2) + 1} \quad (4)$$

$$\overline{V_{n,TX}^2} = 4KT \cdot \frac{r_p |k_m^2 L_p L_s C_1^2 s^4| + r_s \cdot |1 + r_p C_1 s + L_p C_1 s^2|^2}{\left| s^4(L_p L_s C_1 C_2(1-k_m^2)) + s^3(C_1 C_2(L_s r_p + L_p r_s)) + s^2(L_p C_1 + L_s C_2 + r_p r_s C_1 C_2) + s(r_p C_1 + r_s C_2) + 1 \right|^2} \quad (5)$$

In the equations (4) and (5), the parameter $k_m$ is the magnetic coupling factor of the transformer (i.e. 1043 and 1044). The parameter $r_p$ models the equivalent series resistance (i.e. 3022) of the primary winding 1044. The parameter $r_s$ models the equivalent series resistance (i.e. 1042) of the secondary winding 1043 respectively. To reduce the side effect of TXMN 302 on the RX's noise factor F in equation (1), the last term in equation (1) should be minimized. By employing the equations (4) and (5), then substituting parameters $r_p$ and $r_s$ with $L_p \omega/Q_p$ and $L_s \omega/Q_s$ respectively, and assuming $Q_p Q_s \gg 1$, an equation (6) is obtained as follow:

$$\frac{\overline{V_{n,TX}^2}}{|Z_{PA,RX}|^2} = \quad (6)$$

$$\frac{4KT}{L_s\omega Q_s} \cdot \frac{\frac{Q_s}{Q_p}k_m^2 L_p^2 C_1^2\omega^4 + (1 - L_pC_1\omega^2)^2}{\frac{1}{Q_s^2}\left(1 - L_pC_1\omega^2\left(1 + \frac{Q_s}{Q_p}\right)\right)^2 + (1 - L_pC_1\omega^2(1 - k_m^2))^2}$$

According to some embodiments, a global optimum frequency $\omega_{opt}$ that minimizes the contribution of TXMN 302 to the system noise factor. The minimum noise factor can be obtained by using the following equation (7):

$$\omega_{opt}^2 \approx \frac{1}{L_pC_1} \cdot \frac{Q_p}{Q_p + Q_s} \quad (7)$$

To achieve the minimum noise factor penalty, the capacitance $C_1$ of the adjustable capacitor 3024 is adjusted to make the frequency $\omega_{opt}$ equal or near to the frequency $\omega_0$. An equation (8) can be obtained by inserting the equation (7) into the equation (6) as follow:

$$\left(\frac{\overline{V_{n,TX}^2}}{|Z_{PA,RX}|^2}\right)_{min} = \quad (8)$$

$$\frac{4KT}{L_s\omega Q_s} \cdot \frac{k_m^2 Q_p Q_s + Q_s^2}{(Q_s + k_m^2 Q_p)^2} \xrightarrow{Q_p = Q_s} \left(\frac{\overline{V_{n,TX}^2}}{|Z_{PA,RX}|^2}\right)_{min} = \frac{4KT}{L_s\omega Q_s(1 + k_m^2)}$$

As a result, the noise factor penalty reduces with increasing $Q_s$ and $k_m$, which coincides with efforts to optimize the efficiency of the PA's matching network (i.e. 104). However, a step-down transformer, which is formed by 1043, 1044, and 1045, must be employed for the PA's matching network to scale up the load resistance seen by PA's transistor in order to achieve the highest possible efficiency at a relatively low output power of 3 dBm. The scale up of the load resistance may against the noise factor optimization, as evident from the equation (8) and clearly demonstrates a tradeoff between TX (e.g. 108) efficiency and RX (e.g. 106) noise factor. The total noise factor F may be calculated by inserting the equations (2), (3), and (8) into the equation (1), and an equation (9) is obtained as follow:

$$F = 1 + \frac{r_{loss}}{R_S} + \gamma g_m R_s \left(\frac{L_1\omega_0}{R_s}\right)^2 + \frac{R_S}{L_s\omega Q_s(1 + k_m^2)} \quad (9)$$

In addition, the input impedance of the RX (e.g. 106) should be matched to the antenna impedance. The input matching of LNTA 1062 is quite sensitive to the imaginary part of the impedance seen from the output pad (i.e. signal port 110) toward the TX (e.g. 108). Hence, the main resonant frequency of PA's matching network (i.e. 104) is adjusted to near or equal the operating frequency $\omega_0$. It also facilitates designing the PA 1082 and the LNTA 1062 more independently. The fundamental resonant frequency $\omega_{res}$ of the transformer-base resonator may be obtained by the following equation (10):

$$\omega_{res}^2 = \frac{1}{L_pC_1 + L_sC_2} \quad (10)$$

It is noted that the term $L_pC_1$ should be chosen to satisfy the equation (7) in order to achieve the lowest noise factor. Consequently, the capacitance $C_2$ of the adjustable capacitor 1041 may be varied to adjust the resonant frequency $\omega_0$ of the PA's matching network (i.e. 104). By inserting the equation (7) into the equation (10), an equation (11) is obtained as follow:

$$C_2 = \frac{1}{L_s\omega_0^2} \cdot \frac{Q_s}{Q_p + Q_s} \quad (11)$$

Consequently, to simultaneously achieve the lowest noise factor and the input insertion loss, the capacitance $C_1$ of the adjustable capacitor 3024 and the capacitance $C_2$ of the adjustable capacitor 1041 may be adjusted to satisfy the equation (7) and the equation (11) respectively. Under this condition, the TX's output impedance becomes purely resistive and may be estimated by the following equation (12):

$$R_{PA,RX} = L_s\omega_0 Q_s \cdot \left(1 + k_m^2 \frac{Q_p}{Q_s}\right) \quad (12)$$

As a result, the input matching may be realized by adjusting the transconductance gain $g_m$ of the LNTA 1062 by the following equation (13):

$$g_m = \frac{C_{gs}}{L_1} \cdot \left(\frac{R_{PA,RX} \cdot R_s}{R_{PA,RX} - R_s} - r_{loss}\right). \quad (13)$$

Accordingly, in order to receive the RF input signal $S_{rf\_out}$ from the signal port 110 during the receiving mode of the BLE TRX 100, the capacitance $C_1$ of the adjustable capacitor 3024 is adjusted to be a first capacitance and the capacitance $C_2$ of the adjustable capacitor 1041 is adjusted to be a second capacitance to satisfy the equation (7) and the equation (11) respectively. In addition, the capacitance $C_{gs}$ of the adjustable capacitor 1066 is adjusted to be a third capacitance to satisfy the equation (3).

Figure 5:
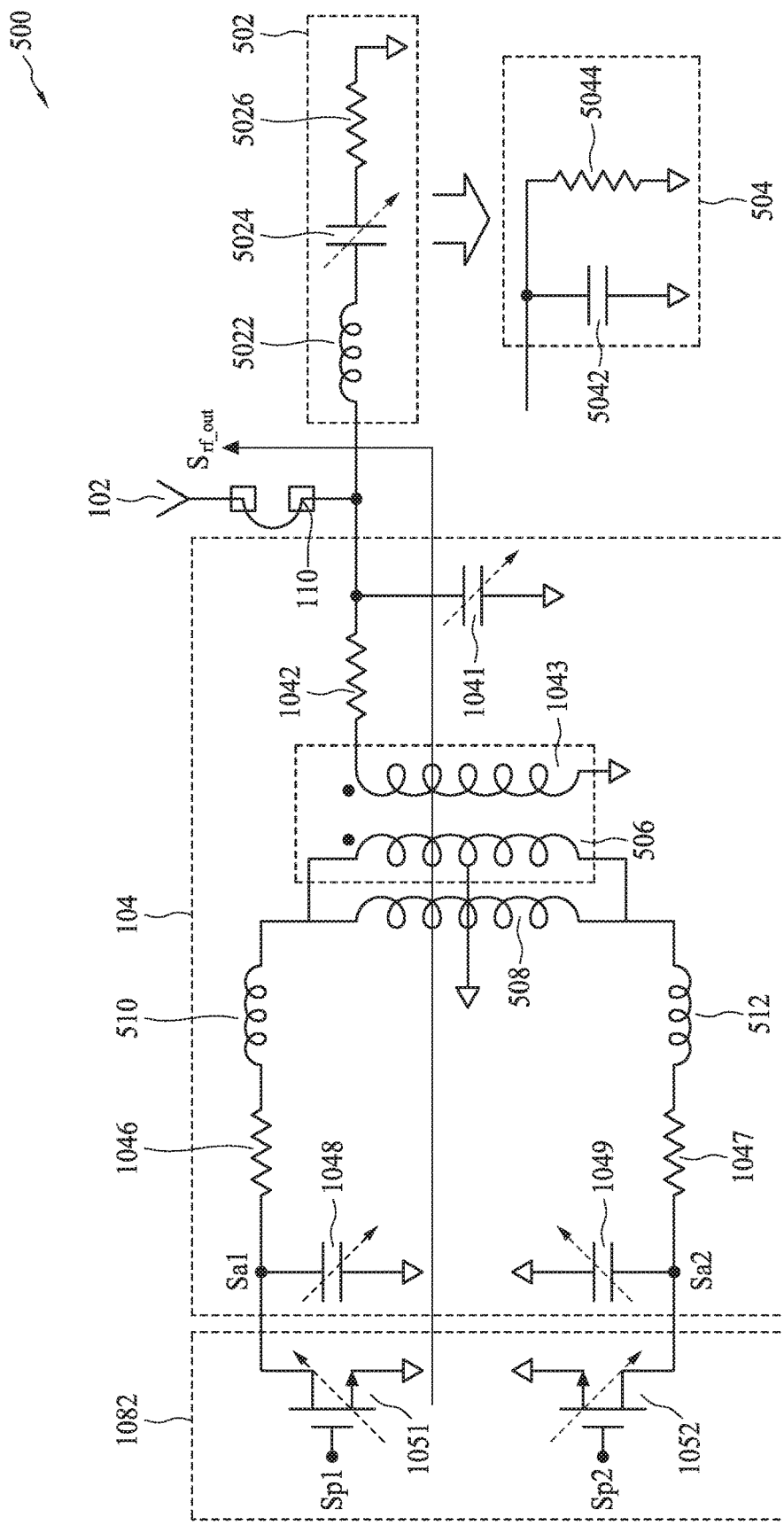
FIG. 5 is a diagram illustrating an equivalent circuit of the front end in FIG. 2 during the transmitting mode in accordance with some embodiments.

On the other hand, during the transmitting mode, the field-effect transistor 1065 of the LNTA 1062 is turned off, and consequently, the LNTA 1062 may be simplified to a series RLC network (RXMN) as shown in FIG. 5. FIG. 5 is a diagram illustrating an equivalent circuit 500 of the front end 200 during the transmitting mode in accordance with some embodiments. During the transmitting mode, an RF output signal $S_{rf\_out}$ is transmitted to the antenna 102 from the DPA 1082 via the matching network 104 and the signal port 112. The gate terminal of the field-effect transistor 1051 receives a first pre-transmit signal Sp1 while the gate terminal of the field-effect transistor 1052 receives a second pre-transmit signal Sp2. The drain terminal of the field-effect transistor 1051 outputs a first amplified signal Sa1 while the drain terminal of the field-effect transistor 1052 outputs a second amplified signal Sa2. It is noted that, the second winding 1044 and the third winding 1045 are re-arranged to be a plurality of inductors 506, 508, 510, and 512 as shown in FIG. 5.

The RLC network 502 comprises an inductor 5022, an adjustable capacitor 5024, and a resistor 5026. The inductance of the inductor 5022 is a total inductance (i.e. $L_1+L_G$) of the inductor 1063 and the inductor 1067. The adjustable capacitor 5024 is similar to the adjustable capacitor 1066, i.e. $C_{gs}$. The resistor 5026 is similar to the resistor 1064, i.e. $r_{loss}$. During the transmitting mode, the arrangement is to alleviate the side effects of the RLC network 502 on the efficiency of the DPA 1082. To analyze the efficiency of the DPA 1082, the RLC network 502 is replaced with an equivalent circuit 504. The equivalent circuit 504 comprises a capacitor 5042 with a capacitance $C_{RX}$ and a resistor 5044 with a resistance $R_{RX}$, wherein the capacitor 5042 is connected to the resistor 5044 in parallel. The capacitance $C_{RX}$ and the resistance $R_{RX}$ may be obtained by the following equations (14) and (15) respectively:

$$R_{RX} = r_{loss} \cdot \left(1 + Q_{RX}^2 \cdot \left(\frac{\omega_{RX}}{\omega_0} - \frac{\omega_0}{\omega_{RX}}\right)^2\right) \quad (14)$$

$$C_{RX} = C_{gs} \cdot \frac{Q_{RX}^2 \cdot \left(\left(\frac{\omega_{RX}}{\omega_0}\right)^2 - 1\right)}{1 + Q_{RX}^2 \cdot \left(\frac{\omega_{RX}}{\omega_0} - \frac{\omega_0}{\omega_{RX}}\right)^2} \quad (15)$$

The parameters $\omega_{RX}$ and $Q_{RX}$ are the resonant frequency and the quality factor of the RLC network 502. The resonant frequency $\omega_{RX}$ may be expressed by the following equation (16):

$$\omega_{RX} = \frac{1}{\sqrt{(L_1+L_G)C_{gs}}} \quad (16)$$

Due to the resistor 5044, the power of the DPA 1082 is dissipated, and the efficiency $\eta_{RX}$ of the DPA 1082 is scaled down by the following equation (17):

$$\eta_{RX} = \frac{R_{RX}}{R_L + R_{RX}} \quad (17)$$

The parameter $R_L$ (e.g. 50 ohm) is the input impedance of the antenna 102. As a result, the side effect of the RLC network 502 on the transmitter efficiency may be minimized by having a relatively large resistance $R_{RX}$. According to the equation (14), when the resonant frequency $\omega_{RX}$ of the RLC network 502 is pushed to a much lower or higher frequency than $\omega_0$ via the adjustable capacitor 1066 (or 5024), the side effect of the RLC network 502 on the transmitter efficiency may be minimized.

During the transmitting mode, the highest efficiency of the DPA 1082 is achieved by adjusting the capacitance $C_{gs}$ of the adjustable capacitor 1066 (or 5024) to its maximum value, and then the capacitances $C_1$ and $C_2$ of the adjustable capacitors 3024 and 1041, respectively, can be tuned to satisfy the required matching network of class-E/F2 operation. According to some embodiments, class-E/F2 tuning exhibits the lowest systematic drain current. Consequently, the DPA 1082 needs a relatively smaller impedance transformation ratio for output power, which results in a lower insertion loss for its matching network and thus higher system efficiency.

Accordingly, in order to transmit the RF output signal $S_{rf\_out}$ to the signal port 110 from the DPA 1082 during the transmitting mode of the BLE TRX 100, the capacitance $C_1$ of the adjustable capacitor 3024 is adjusted to be a fourth capacitance and the capacitance $C_2$ of the adjustable capacitor 1041 is adjusted to be a fifth capacitance to satisfy the required matching network of the class E/F2 power amplifier (i.e. 1082). In addition, the capacitance $C_{gs}$ of the adjustable capacitor 1066 is adjusted to be a sixth capacitance to achieve the highest efficiency of the DPA 1082.

According to some embodiments, the fourth capacitance of the adjustable capacitor 3024 is different from the first capacitance of the adjustable capacitor 3024. The fifth capacitance of the adjustable capacitor 1041 is different from the second capacitance of the adjustable capacitor 1041. The sixth capacitance of the adjustable capacitor 1066 is different from the third capacitance of the adjustable capacitor 1066. For example, the sixth capacitance of the adjustable capacitor 1066 may be greater than the third capacitance of the adjustable capacitor 1066.

According to some embodiments, the field-effect transistors 1051 and/or 1052, and/or the adjustable capacitors 3024, 1041, and/or 1066 may be connected to at least one serial peripheral interface (SPI) 116. A host 118 is arranged to generate a plurality of digital signals, e.g. four bits signal, for controlling the operation of the field-effect transistors 1051 and/or 1052, and/or the values of the adjustable capacitors 3024, 1041, and/or 1066 via the SPI 116.

Figure 6:
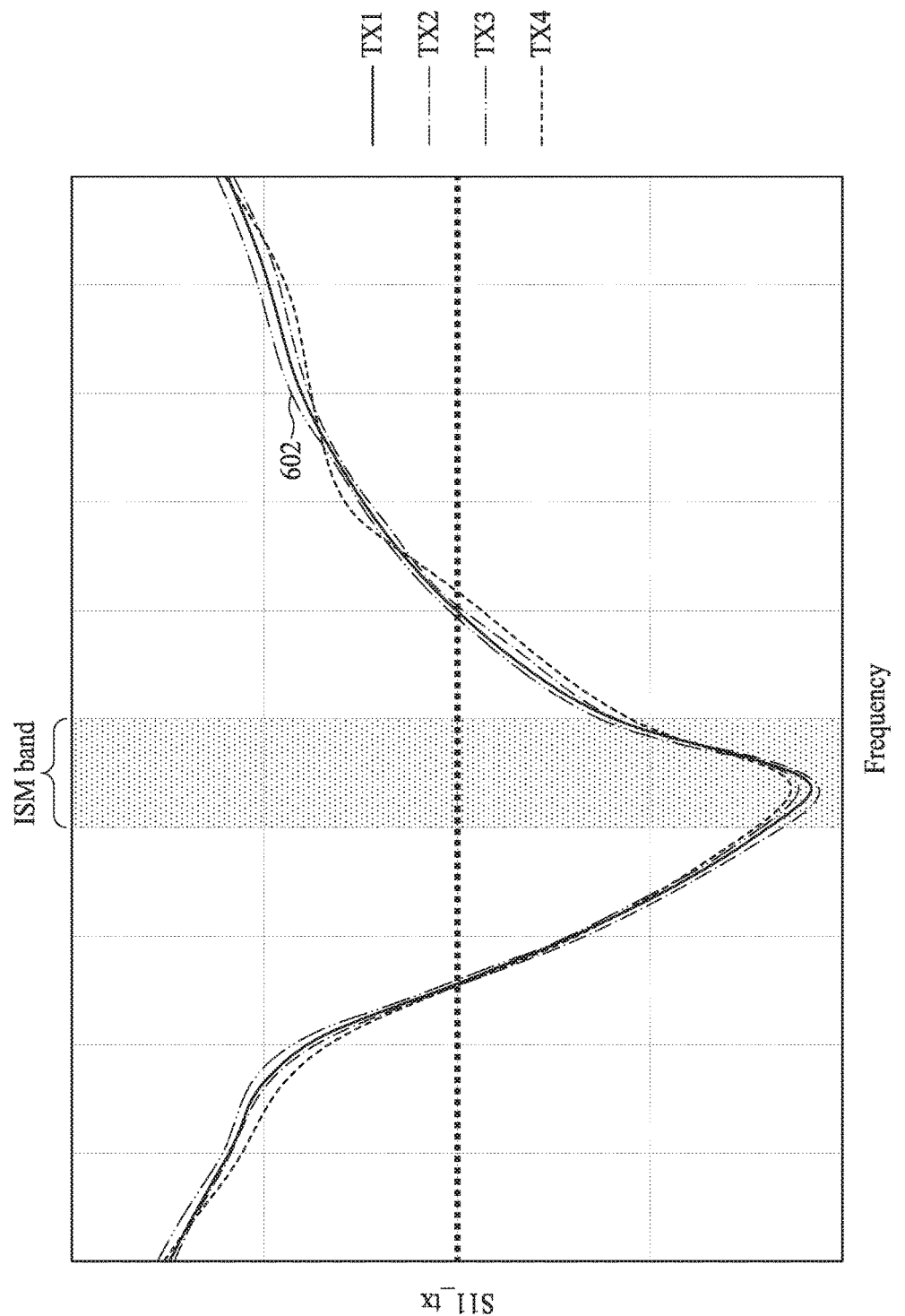
FIG. 6 is a diagram illustrating a return loss at a signal port during the transmitting mode in accordance with some embodiments.

FIG. 6 is a diagram illustrating a return loss S11_tx at the signal port 110 of the BLE TRX 100 during the transmitting mode in accordance with some embodiments. The curve 602 shows the value of the return loss S11_tx versus the frequency band. According to some embodiments, the value of the return loss S11_tx is between −19 to −13 dB across the Industrial Scientific Medical Band (ISM band), e.g. 2400-2483.5 MHz, during the transmitting mode.

Figure 7:
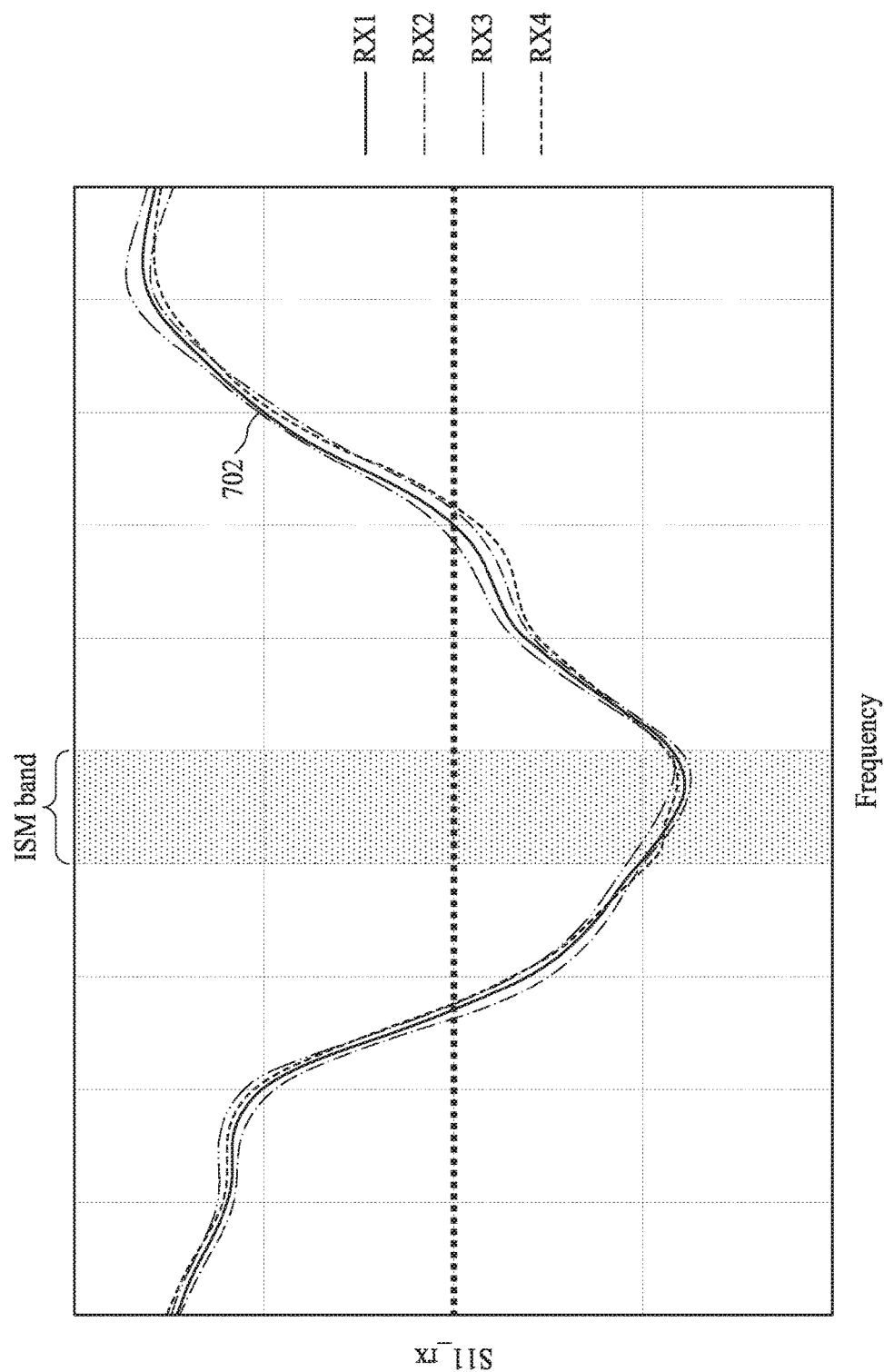
FIG. 7 is a diagram illustrating a return loss at a signal port during the receiving mode in accordance with some embodiments.

FIG. 7 is a diagram illustrating a return loss S11_rx at the signal port 110 of the BLE TRX 100 during the receiving mode in accordance with some embodiments. The curve 702 shows the value of the return loss S11_rx versus the frequency band. According to some embodiments, the value of the return loss S11_rx is below −15 dB across the ISM band during the receiving mode.

According to the embodiments, a single-chip ultra-low power TRX for IoT applications, fully compliant with the BLE standard, is demonstrated in a digital CMOS technology. Two of the objectives of the embodiments are: 1) full monolithic integration and 2) maximum power efficiency. Toward the first goal, active devices associated with a digitally controlled oscillator (DCO) and a PA are placed underneath their passive RF components to promote vertical integration of passive/active components as opposed to their almost exclusive lateral monolithic integration done conventionally. The TX and RX share a single pin or port for a direct connection to an antenna. Toward the second goal, the embodiments implement several power-saving techniques, taking advantage of the relaxed specifications defined in the standard. The TX directly modulates the DCO in an open-loop manner. The RX is a DT super heterodyne architecture performing amplification and filtering using charge sharing (CS) complex-signaling bandpass filters (BPFs).

According to some embodiments, a transceiving device is provided. The transceiving device comprises a signal port, a receiver, a transmitter, and a first adjustable capacitor. The signal port is arranged to relay a radio frequency (RF) input signal during a first mode, and to relay an RF output signal during a second mode different from the first mode. The receiver is coupled to the signal port. The transmitter is coupled to the signal port. The first adjustable capacitor is coupled to the signal port. The second adjustable capacitor is arranged to have a first capacitance during the first mode such that the RF input signal is received by the receiver, and the second adjustable capacitor is arranged to have a second capacitance during the second mode such that the RF output signal is transmitted to the signal port.

According to some embodiments, a transceiving device is provided. The transceiving device comprises a signal port, a first amplifier, a second amplifier, and a matching network. The signal port is coupled to an antenna. The first amplifier is coupled to the signal port. The second amplifier is coupled to the signal port. The matching network is coupled between the second amplifier and the signal port. The second amplifier is turned off and the first amplifier is turned on to receive a radio frequency (RF) input signal from the antenna during a first mode, and the first amplifier is turned off and the second amplifier is turned on to transmit an RF output signal to the antenna during a second mode different from the first mode.

According to some embodiments, a transceiving device is provided. The transceiving device comprises a signal port, a first amplifier, a second amplifier, and a matching network. The signal port is coupled to an antenna. The first amplifier is coupled to the signal port. The second amplifier is coupled to the signal port. The matching network is coupled between the second amplifier and the signal port. The second amplifier and the matching network are configured to be a resonator and the first amplifier is arranged to receive a radio frequency (RF) input signal from the antenna during a first mode, and the first amplifier is configured to be a RLC (Resistor-inductor-capacitor) network and the second amplifier is arranged to transmit an RF output signal to the antenna during a second mode different from the first mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transceiving device, comprising:
   a signal port, arranged to relay a radio frequency (RF) input signal during a first mode, and to relay an RF output signal during a second mode different from the first mode;
   a receiver, coupled to the signal port;
   a transmitter, coupled to the signal port; and
   a first adjustable capacitor, coupled to the signal port;
   wherein the first adjustable capacitor is arranged to have a first capacitance during the first mode such that the RF input signal is received by the receiver, and the first adjustable capacitor is arranged to have a second capacitance during the second mode such that the RF output signal is transmitted to the signal port,
   wherein the receiver includes a first amplifier having an input terminal, an output terminal for outputting a receiving signal and a first capacitor, having a first terminal coupled to the signal port,
   wherein the input terminal of the first amplifier is coupled to a second terminal of the first capacitor,
   wherein the first amplifier includes a second adjustable capacitor arranged to have a third capacitance during the first mode, and arranged to have a fourth capacitance during the second mode; a first inductor, having a first terminal coupled to the second terminal of the first capacitor; a field-effect transistor, having a gate terminal coupled to a second terminal of the first inductor, and a drain terminal for outputting the receiving signal, wherein the second adjustable capacitor includes a first terminal coupled to the gate terminal, and a second terminal coupled to a source terminal of the field-effect transistor; and a second inductor, having a first terminal coupled to the source terminal, and a second terminal coupled to a reference voltage level.

2. The transceiving device of claim 1, wherein the receiver further comprises:
   a first capacitor, having a first terminal coupled to the signal port, wherein
   the input terminal of the first amplifier is coupled to a second terminal of the first capacitor.

3. The transceiving device of claim 2, wherein the first amplifier comprises:
   a first inductor, having a first terminal coupled to the second terminal of the first capacitor;
   a field-effect transistor, having a gate terminal coupled to a second terminal of the first inductor, and a drain terminal for outputting the receiving signal;
   the second adjustable capacitor includes a first terminal coupled to the gate terminal, and a second terminal coupled to a source terminal of the field-effect transistor; and
   a second inductor, having a first terminal coupled to the source terminal, and a second terminal coupled to a reference voltage level.

4. The transceiving device of claim 3, wherein the fourth capacitance is greater than the third capacitance.

5. The transceiving device of claim 3, wherein the field-effect transistor is turned off during the second mode.

6. The transceiving device of claim 1,
   wherein the transmitter comprises: a second amplifier, having a plurality of input terminals for receiving a plurality of pre-transmit signals respectively; and
   a matching network, having a plurality of first terminals coupled to a plurality of output terminals of the second amplifier respectively, and a second terminal coupled to the signal port.

7. The transceiving device of claim 6, wherein the second amplifier comprises:
   a first field-effect transistor, having a gate terminal for receiving a first pre-transmit signal, a source terminal coupled to a first reference voltage level, and a drain terminal for outputting a first amplified signal; and
   a second field-effect transistor, having a gate terminal for receiving a second pre-transmit signal, a source terminal coupled to the first reference voltage level, and a drain terminal for outputting a second amplified signal; and
   the matching network comprises: a first winding, having a first terminal coupled to the drain terminal of the first field-effect transistor, and a second terminal coupled to the drain terminal of the second field-effect transistor;
   a second winding, electromagnetically coupled to the first winding, having a first terminal coupled to the signal port, and a second signal coupled to the first reference voltage level; and a third winding, having a first terminal coupled to the first winding, and a second signal coupled to a second reference voltage level different from the first reference voltage level; and a capacitor, having a first terminal coupled to the second terminal of the third winding, and a second terminal coupled to the first reference voltage level.

8. The transceiving device of claim 7, wherein the transmitter further comprises:

a first adjustable capacitor, having a first terminal coupled to the drain terminal of the first field-effect transistor, and a second terminal coupled to the first reference voltage level; and a second adjustable capacitor, having a first terminal coupled to the drain terminal of the second field-effect transistor, and a second terminal coupled to the first reference voltage level;

wherein the first adjustable capacitor and the second adjustable capacitor are arranged to have a third capacitance during the first mode, and the first adjustable capacitor and the second adjustable capacitor are arranged to have a fourth capacitance during the second mode.

9. The transceiving device of claim 7, wherein the first field-effect transistor and the second field-effect transistor are turned off during the first mode.

10. The transceiving device of claim 7, wherein the first winding, the second winding, and the third winding are arranged to be a second-order resonator during the first mode.

11. A transceiving device, comprising:

a signal port, coupled to an antenna;

a first amplifier, coupled to the signal port;

a second amplifier, coupled to the signal port;

a matching network, coupled between the second amplifier and the signal port, wherein the second amplifier is turned off and the first amplifier is turned on to receive a radio frequency (RF) input signal from the antenna during a first mode, and the first amplifier is turned off and the second amplifier is turned on to transmit an RF output signal to the antenna during a second mode different from the first mode;

a first adjustable capacitor, having a first terminal coupled to the signal port and a second terminal coupled to a reference voltage level, arranged to have a first capacitance during the first mode and a second capacitance during the second mode;

a second adjustable capacitor, having a first terminal coupled to an output terminal of the second amplifier and a second terminal coupled to the reference voltage level, arranged to have a third capacitance during the first mode and a fourth capacitance during the second mode; and a third adjustable capacitor, having a first terminal coupled to an input terminal of the first amplifier and a second terminal coupled to the reference voltage level, arranged to have a fifth capacitance during the first mode and a sixth capacitance during the second mode.

12. The transceiving device of claim 11, wherein the matching network is directly connected to the signal port.

13. The transceiving device of claim 11, further comprising:

a capacitor, coupled between the first amplifier and the signal port.

14. The transceiving device of claim 13, wherein the capacitor is directly connected to the signal port.

15. A transceiving device, comprising:

a signal port, coupled to an antenna;

a first amplifier, coupled to the signal port;

a second amplifier, coupled to the signal port; and a matching network, coupled between the second amplifier and the signal port;

wherein the second amplifier and the matching network are configured to be a resonator and the first amplifier is arranged to receive a radio frequency (RF) input signal from the antenna during a first mode, and the first amplifier is configured to be a RLC (Resistor-inductor-capacitor) network and the second amplifier is arranged to transmit an RF output signal to the antenna during a second mode different from the first mode; and wherein the matching network includes a first adjustable capacitor, having a first terminal coupled to the signal port and a second terminal coupled to a reference voltage level, arranged to have a first capacitance during the first mode and a second capacitance during the second mode, and a second adjustable capacitor, having a first terminal coupled to an output terminal of the second amplifier and a second terminal coupled to the reference voltage level, arranged to have a third capacitance during the first mode and a fourth capacitance during the second mode.

16. The transceiving device of claim 15, further comprising:

a capacitor, coupled between the first amplifier and the signal port.

17. The transceiving device of claim 16, wherein the capacitor is directly connected to the signal port.

18. The transceiving device of claim 15 wherein the matching network is directly connected to the signal port.

19. The transceiving device of claim 15, wherein a resonant frequency of the resonator substantially equals an operating frequency of the RF input signal.

* * * * *